United States Patent
Gelnovatch et al.

[11] Patent Number: 6,084,523
[45] Date of Patent: Jul. 4, 2000

[54] NON-INTRUSIVE BATTERY STATUS INDICATOR AND INVENTORY SYSTEM

[75] Inventors: Vladimir G. Gelnovatch, Manasquan; Rudolf G. Buser, Wall, both of N.J.

[73] Assignee: The United States of America as represented by the Secretary of the Army, Washington, D.C.

[21] Appl. No.: 09/114,799

[22] Filed: Jul. 13, 1998

[51] Int. Cl.$^7$ .................................................. G08B 21/00
[52] U.S. Cl. ............................ 340/636; 342/175; 320/48
[58] Field of Search ........................... 340/636; 342/175; 320/48

[56] References Cited

U.S. PATENT DOCUMENTS

| | | | |
|---|---|---|---|
| 4,893,126 | 1/1990 | Evans | 342/175 |
| 5,455,499 | 10/1995 | Uskali et al. | 340/636 |
| 5,475,295 | 12/1995 | Hong | 340/636 |
| 5,559,499 | 9/1996 | Haubner | 340/636 |
| 5,805,068 | 9/1998 | Bradus | 340/636 |
| 5,805,069 | 9/1998 | Mitsui et al. | 340/636 |
| 5,929,764 | 7/1999 | Brink et al. | 340/636 |

*Primary Examiner*—Daniel J. Wu
*Assistant Examiner*—John Tweel, Jr.
*Attorney, Agent, or Firm*—Michael Zelenka; George B. Tereschuk

[57] ABSTRACT

An apparatus and method of measuring and/or determining the status of battery parameters by receiving and/or decoding an RF information signal from a sensor/transceiver located in the target battery, where the RF information signal contains information regarding the status of particular parameters of the target battery. In particular embodiments, the sensor/transceiver located in the target battery is operable to measure battery parameters such as voltage and charge status, store particular battery parameters to and retrieve particular battery parameters from a memory located in the battery, and transmit RF information signals containing battery information regarding the particular battery parameters to a so called readout unit. The readout unit is operable to receive and/or decode the received RF information signal, determine the status of particular parameters based on the battery information contained in the received RF information signal, and display the status information. Advantageously, the present invention enables the determination of the status of particular battery parameters without having to make contact with the target battery itself.

14 Claims, 4 Drawing Sheets

6,084,523

NON-INTRUSIVE BATTERY STATUS INDICATOR AND INVENTORY SYSTEM

GOVERNMENT INTEREST

The invention described herein may be manufactured, used, and licensed by or for the Government for governmental purposes without the payment to us of any royalty thereon

FIELD OF THE INVENTION

The present invention relates to the field of batteries and, more particularly, to a method and apparatus for evaluating the status of battery parameters.

BACKGROUND OF THE INVENTION

In many applications it is very important to quickly and easily determine the status of battery parameters. For example, in some military applications it is important to determine the status of battery parameters such as voltage, charge status, battery type, battery chemistry, charge cycles undergone, and date of manufacture so that a military unit can be properly prepared and outfitted for a mission. Determining the status of such battery parameters has also become important in applications involving so called smart chargers which are operable to monitor and automatically charge a battery to which it is connected.

Presently, however, there are few devices that provide a quick and easy means for determining the status of battery parameters. In addition, there are few devices that are operable to determine the status of more than one battery parameter. Moreover, most conventional devices must make physical contact with the battery in order to obtain the status of such battery parameters. For example, conventional battery voltage indicators are operable to determine the status of only the battery voltage or charge, and must be physically connected to the terminals of the battery in order to determine such status information.

SUMMARY OF THE INVENTION

The present invention is an apparatus and method for providing a quick and easy measurement and/or determination of the status of battery parameters without making any physical contact with the target battery. The term target battery as used herein refers to the battery for which the status of particular parameters are being determined.

In accordance with the principles of the present invention, the status of a particular battery parameter is measured and/or determined by decoding an information signal received from a sensor/transceiver located in the target battery, where the information signal is a radio frequency (RF) signal containing battery information regarding particular parameters. The term battery information as used herein refers to data obtained by measuring the physical characteristics of the target battery and/or data obtained by retrieving characteristics of the battery parameters stored in a memory. Thus, an apparatus in accordance with the principles of the present invention includes a means for determining the status of particular parameters of a target battery, based on the battery information contained in an information signal transmitted by a sensor/transceiver located in the target battery.

In particular embodiments, the means for determining the status of particular parameters includes a so-called readout unit which is operable to: (1) send a request signal to a sensor/transceiver located in the target battery, where the request signal is an RF signal containing a request for the information regarding particular parameters; (2) receive an information signal from the sensor/transceiver; (3) decode the information signal to determine the status of the particular parameters; and (4) display the determined status of each parameter. Thus, a battery in accordance with the principles of the present invention has an internal sensor/transceiver operable to measure and/or retrieve the status of particular parameters of the battery, and transmit an information signal as described above.

Advantageously, the present invention enables the rapid evaluation of a plurality of battery parameters from a location which is remote from the target battery.

DETAILED DESCRIPTION

Figure 1:
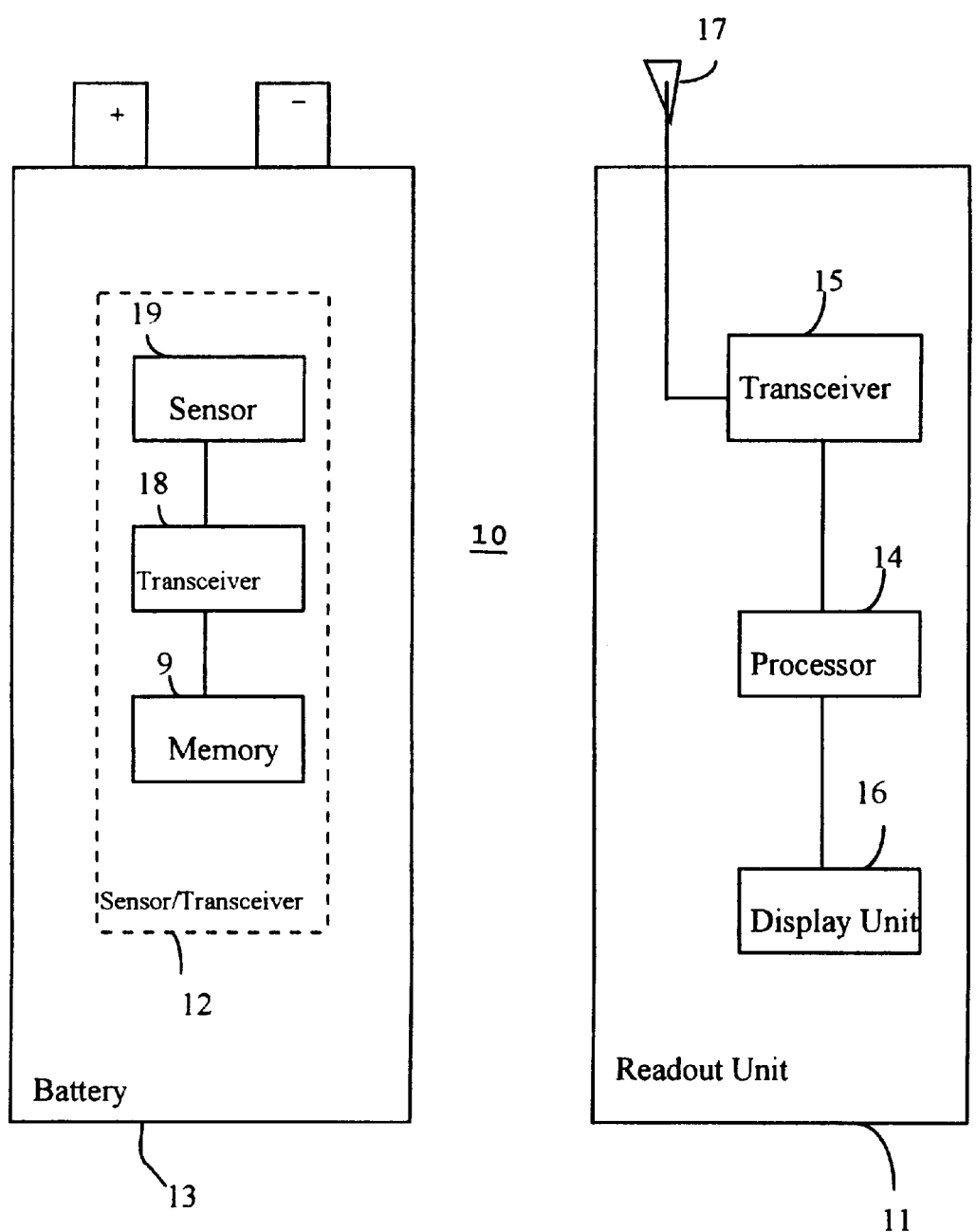
FIG. 1 is a block diagram of an illustrative embodiment of an apparatus for measuring and/or determining the status of battery parameters in accordance with the principles of the present invention.

Referring now to FIG. 1 there is shown an illustrative embodiment of an apparatus 10 for measuring and/or determining the status of battery parameters in accordance with the principles of the present invention. As shown, apparatus 10 includes a readout unit 11 and a sensor/transceiver 12 which is located in a target battery 13. Readout unit 11 has a processor 14 which is connected to a display unit 16 and a monolithic millimeter-wave integrated circuit (MMIC) transceiver or transceiver 15, where transceiver 15 is connected to a high gain antenna or antenna 17. Sensor/transceiver 12 has an MMIC transceiver or transceiver 18 which is connected to a sensor 19 and a memory 9.

In operation, readout unit 11 sends a request signal from transceiver 15 through antenna 17, where the request signal, as described above, is an RF signal containing a request for information regarding the status of particular parameters of target battery 13. Antenna 17 is a high gain directional antenna which enables readout unit 11 to selectively communicate with only target battery 13, and enables the request signal to penetrate the internal volume of target battery 13 to reach transceiver 18. When transceiver 18 receives the request signal it obtains, from sensor 19 and memory 9, battery information regarding the status of the particular parameters requested by readout unit 11. Sensor 19 is operable to measure the voltage and/or charge status, the chemical composition, and the number of charge cycles undergone for battery 13. The memory is programmed with the battery manufacture date. Once transceiver 18 obtains information regarding the particular parameters, it transmits an information signal to transceiver 15 located in readout unit 11, where the information signal, as described above, is an RF signal containing the battery information regarding the particular parameters. Transceiver 11 then passes the battery information to processor 14 which, based on the battery information, determines the status of the particular parameters, and passes that status information to display unit 16 for visual display.

Advantageously, apparatus 10 provides a means for quickly measuring and/or determining the status of a plurality of battery parameters without making physical contact with target battery 13 itself. Thus, such measurements and/or determinations can be made from a remote location.

It should be noted that apparatus 10 is only presented to illustrate an apparatus for measuring and/or determining the status of battery parameters in accordance with the principles of the present invention. Thus, the present invention is not limited to the particular embodiment of apparatus 10.

Figure 2:
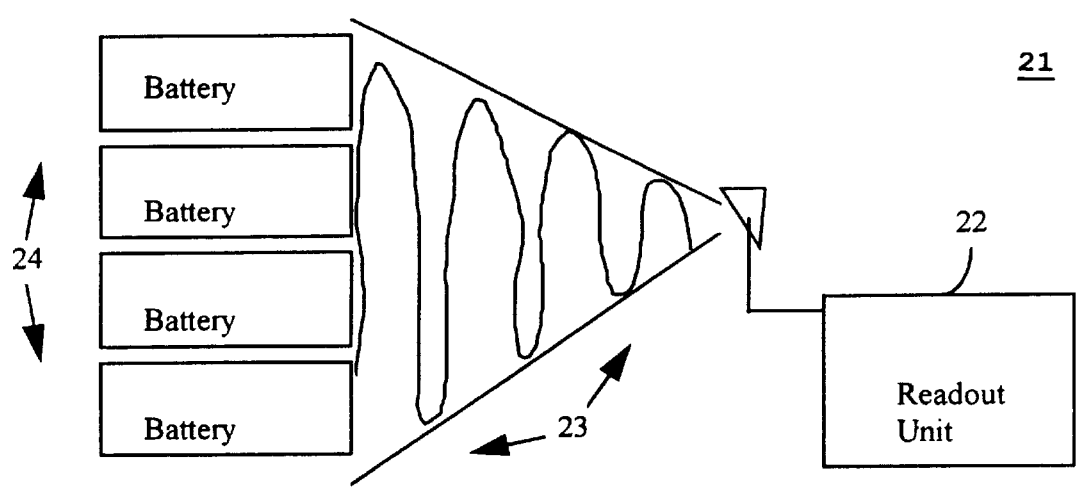
FIG. 2 is a block diagram of an illustrative embodiment of an apparatus for measuring and/or determining the status of the parameters of a plurality of batteries, in accordance with the principles of the present invention.

In other particular embodiments, an apparatus in accordance with the principles of the present invention is operable to measure and/or determine the status of particular battery parameters for a plurality of target batteries at one time. Referring now to FIG. 2, there is shown an illustrative embodiment of an apparatus 21 for measuring and/or determining the status of parameters of a plurality of batteries, in accordance with the principles of the present invention. As shown, apparatus 21 has a readout unit 22. Readout unit 22 is operable to: (1) transmit a request signal over an expanded transmission pattern 23 to a plurality of batteries 24; (2) receive information signals from each of the batteries 24; and (3) determine the status of the particular parameters of each battery, based on information contained in the received information signals. The status information determined for each battery 24 is correlated to a battery serial number transmitted with each set of status information. As a result, in accordance with the principles of the present invention, request signals and the information signals can be simultaneously or individually directed to and received from each of batteries 24 in order to obtain the status information therefor.

It should be noted that the sensor/transceiver embedded in the target battery or batteries only requires a few microwatts when operating in a so called standby mode.

The standby mode is that mode wherein the sensor transceiver "listens" for the first RF signal from transceiver of the readout unit. Thus, unless apparatus 10 or 21 continuously requests status information, the sensor/transceiver embedded in the target battery does not unduly drain the charge of the battery.

It should also be noted that the sensor/transceiver located in a target battery can be molded into the target battery by any means desired by those skilled in the art, as long as the desired means does not interfere with the functionality of the battery. As a result, a battery in accordance with the principles of the present invention includes an internal sensor/transceiver that is operable to transmit RF information signals containing information regarding the status of particular parameters of a battery. In particular embodiments of such a battery, the sensor transceiver is further operable to receive requests signals, as described above.

Figure 3:
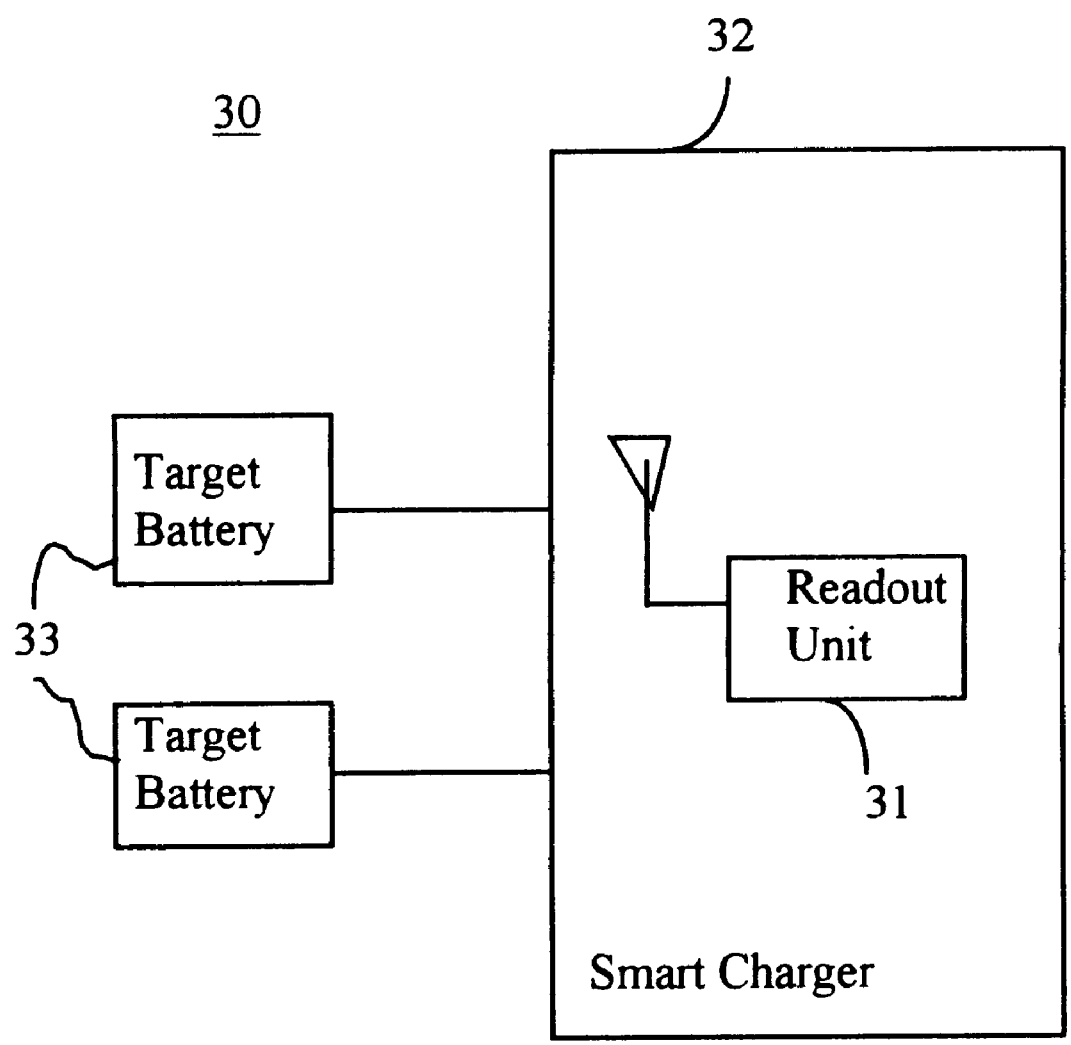
FIG. 3 is a block diagram of a smart charger employing the use of an apparatus in accordance with the principles of the present invention.

Referring now to FIG. 3, there is shown an illustrative embodiment of an apparatus 30 in accordance with the principles of the present invention. As shown, apparatus 30 has a readout unit 31 which is part of a smart charger 32. Smart charger 32 is operable to use readout unit 31 to acquire the status of particular battery parameters of target batteries 33 to program a charger for the automatic charge of a target battery found to have a "low" charge status.

Figure 4:
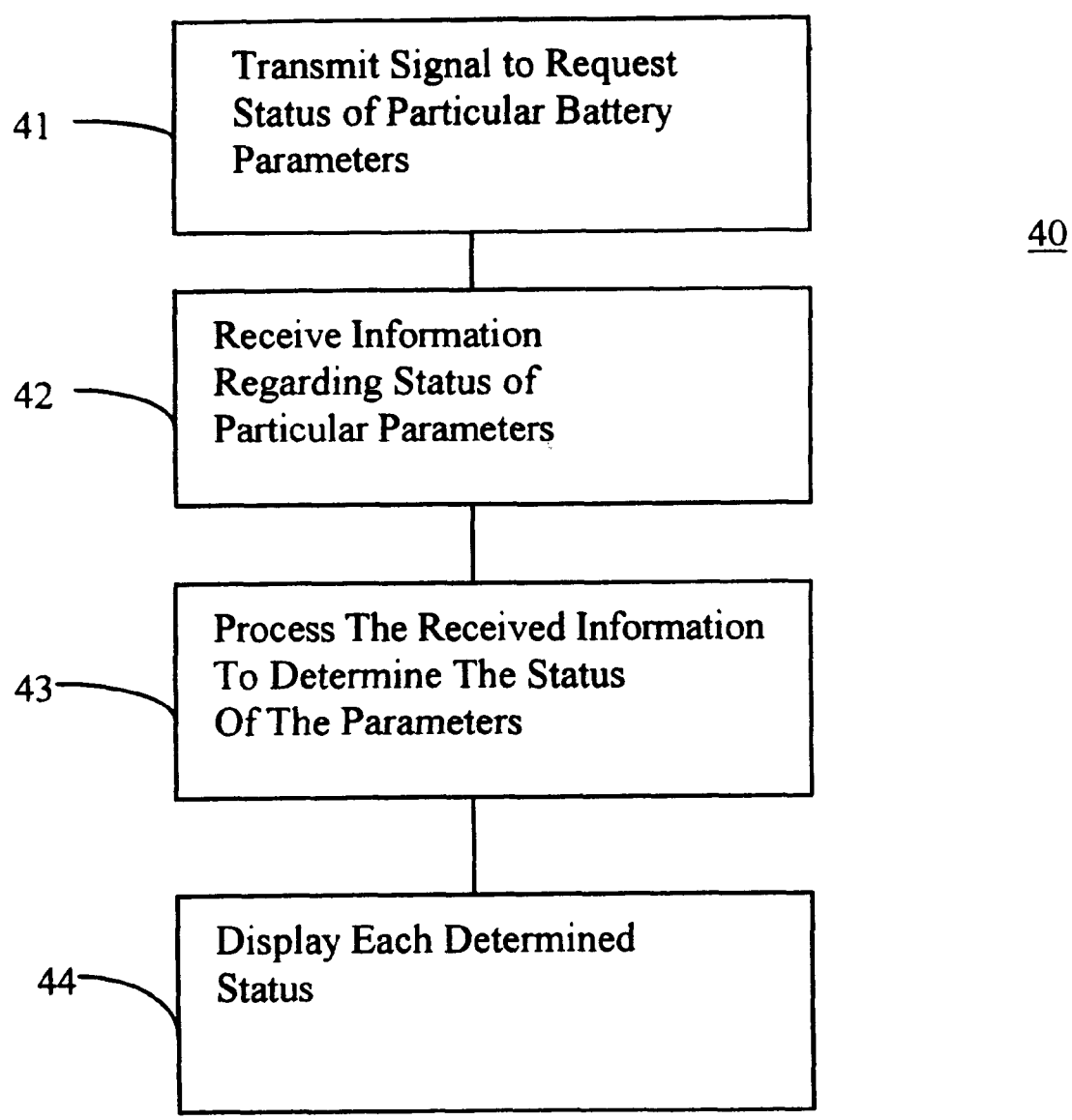
FIG. 4 is a block diagram of an illustrative embodiment of a method for measuring and/or determining the status of battery parameters in accordance with the principles of the present invention.

Referring now to FIG. 4, there is shown a method 40 for measuring/determining the status of battery parameters in accordance with the principles of the present invention. As shown, method 40 begins at inquiry step 41 wherein an RF request signal is transmitted from a readout unit to a sensor/transceiver located in a target battery to request the status of particular parameters of the target battery. Then, at receiving step 42, an RF information signal containing battery information regarding the status of the particular parameters of the target battery is received from the sensor/transceiver located in the battery. The received battery information is then processed by a processor, at determining step 43, to determine the status of the particular parameters. The status of the particular parameters are then displayed, at display step 44.

For clarity of explanation, the embodiment of the present invention shown in FIG. 1 and described above is merely illustrative. Thus, for example, it will be appreciated by those skilled in the art that the block diagram shown and described herein represents a conceptual view of illustrative circuitry embodying the principles of the invention. The functions of the various elements shown in FIG. 1 could be implemented by one or more programmed processors, digital signal processing (DSP) chips, or the like rather than individual hardware elements.

Similarly, the embodiment of the method steps shown in FIG. 4 and described herein are merely illustrative. Thus, for example, it will be appreciated by those skilled in the art that the specific method shown and described herein represent a conceptual view of illustrative steps embodying the principles of the present invention. In addition, it will be appreciated by those skilled in the art that any set of steps or means can be employed to accomplish the steps shown and described herein.

In the claims hereof any element expressed as a means for performing a specified function is intended to encompass any way of performing that function including, for example, a) a combination of circuit elements which performs that function or b) software in any form (including, therefore, firmware, microcode or the like) combined with appropriate circuitry for executing the software to perform the function. The invention defined by such claims resides in the fact that the functionalities provided by the various recited means are combined and brought together in the manner in which the claims call for. Applicant thus regards any means which can provide-those functionalities as equivalent as those shown herein.

It will be appreciated by those skilled in the art that they will be able to devise various arrangements which, though not explicitly shown or described herein, embody the principles of the present invention and thus are within its spirit and scope.

What is claimed is:

1. A non-intrusive battery status indicator and charging apparatus comprising:

a means for receiving an information signal from a sensor/transceiver embedded in a battery, said information signal being a radio frequency (RF) signal containing battery information, said receiving means being remotely located from said battery;

a processor for determining the status of a plurality of battery parameters, based on said battery information contained in said information signal is coupled to said receiving means;

a means for displaying the determined status of said particular parameters of said battery is coupled to said receiving means;

said sensor/transceiver being a monolithic millimeter-wave integrated circuit (MMIC) transceiver;

said battery being a first one of a plurality of batteries, each of said plurality of batteries having at least one of said sensor/transceivers;

a means for transmitting an RF request signal is coupled to said receiving means, said transmitting means sending said RF request signal to each of said plurality of batteries at one time to request the transmission of said information signals;

said receiving means, having a transceiver for receiving multiple signals from, and sending multiple signals to, said MMIC transceiver and an antenna, receives said information signals from each of said plurality of batteries;

said information signals containing said plurality of battery parameters;

said plurality of battery parameters including battery voltage, charge status, battery type, battery chemistry, charge cycles undergone, battery serial number and date of battery manufacture;

said apparatus determining said plurality of battery parameters from each of said said plurality of batteries at one time;

said plurality of battery parameters being correlated to said battery serial number for each of said plurality of batteries;

said request signals and said information signals being simultaneously directed to and received from each of said plurality of batteries to obtain the status information therefor;

a smart charger having a readout unit;

said readout unit, receiving said plurality of battery parameters, determines when said charge status of said one of the plurality of batteries is lower than a predetermined amount;

said readout unit providing a low charge input for said one of the plurality of batteries to said smart charger; and said smart charger causes a charger to automatically charge said one of the plurality of batteries.

2. A remote battery monitoring and charging system, comprising:

least one battery;

a means for transmitting RF signals to an external transceiver, said RF signals containing battery information including a plurality of battery parameters;

a sensor measuring said Plurality of battery parameters;

a means for receiving an RF request signal from said external transceiver, said RF request signal being a request for said battery information;

said transmitting means and said request receiving means form a MIMIC transceiver, said MIMIC transceiver and said sensor being embedded in said battery;

said battery being a first one of a plurality of batteries, each of said plurality of batteries having at least one of said sensors and one of said MIMIC transceivers;

a processor for determining the status of said plurality of battery parameters based on said battery information and a means for displaying the determined status of said battery parameters are coupled to said external transceiver;

said external transceiver, receiving multiple signals from, and sending multiple signals to, said MMIC transceiver and an antenna, requests the transmission of said information signals from each of said plurality of batteries at one time;

said external transceiver receives said information signals from each of said plurality of batteries, said information signals containing said plurality of battery parameters;

said plurality of battery parameters including battery voltage, charge status, battery type, battery chemistry, charge cycles undergone, battery serial number and date of battery manufacture;

said processor determining said plurality of battery parameters from each of said plurality of batteries at one time;

said plurality of battery parameters being correlated to said battery serial number for each of said plurality of batteries;

said request signals and said information signals being simultaneously directed to and received from each of said plurality of batteries to obtain the status information therefor;

a smart charger having a readout unit;

said readout unit, receiving said plurality of battery parameters, determines when said charge status of said one of the plurality of batteries is lower than a predetermined amount;

said readout unit providing a low charge input for said one of the plurality of batteries to said smart charger; and said smart charger causes a charger to automatically charge said one of the plurality of batteries.

3. The non-intrusive battery status indicator and charging apparatus, as recited in claim 1, further comprising said readout unit transmitting said request signal over an expanded transmission pattern to said plurality of batteries.

4. The non-intrusive battery status indicator and charging apparatus, as recited in claim 3, further comprising:

said sensor/transceiver embedded in each of the plurality of batteries operating in a standby mode;

said sensor/transceiver operating in said standby mode requires a few microwatts of battery capacity to prevent draining the charge of each of said plurality of batteries.

5. The non-intrusive battery status indicator and charging apparatus, as recited in claim 4, further comprising said sensor/transceiver being responsive to a first RF signal request from transceiver of the readout unit during said standby mode.

6. The non-intrusive battery status indicator and charging apparatus, as recited in claim 5, further comprising said antenna being a high gain directional antenna.

7. The non-intrusive battery status indicator and charging apparatus, as recited in claim 6, further comprising providing a battery inventory system by monitoring a large group of said batteries from a plurality of remote locations.

8. The non-intrusive battery status indicator and charging apparatus, as recited in claim 7, further comprising molding said sensor/transceiver within each of said plurality of batteries without interfering with the functionality of the battery.

9. The remote battery monitoring and charging system, as recited in claim 2, further comprising said readout unit transmitting said request signal over an expanded transmission pattern to said plurality of batteries.

10. The remote battery monitoring and charging system, as recited in claim 9, further comprising:

said sensor and MIMIC transceiver embedded in each of the plurality of batteries operating in a standby mode;

said sensor and MIMIC transceiver operating in said standby mode requires a few microwatts of battery capacity to prevent draining the charge of each of said plurality of batteries.

11. The remote battery monitoring and charging system, as recited in claim 10, further comprising said sensor and MIMIC transceiver being responsive to a first RF signal request from transceiver of the readout unit during said standby mode.

12. The remote battery monitoring and charging system, as recited in claim 11, further comprising said antenna being a high gain directional antenna.

13. The remote battery monitoring and charging system, as recited in claim 12, further comprising providing a battery inventory system by monitoring a large group of said batteries from a plurality of remote locations.

14. The remote battery monitoring and charging system, as recited in claim 13, further comprising molding said sensor/transceiver within each of said plurality of batteries without interfering with the functionality of the battery.

* * * * *